US008377821B2

(12) United States Patent
Nie

(10) Patent No.: US 8,377,821 B2
(45) Date of Patent: Feb. 19, 2013

(54) METHOD FOR FORMING CONTACT HOLE STRUCTURE

(75) Inventor: Jiaxiang Nie, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 254 days.

(21) Appl. No.: 12/850,349

(22) Filed: Aug. 4, 2010

(65) Prior Publication Data

US 2011/0034025 A1 Feb. 10, 2011

(30) Foreign Application Priority Data

Aug. 6, 2009 (CN) .......................... 2009 1 0056025

(51) Int. Cl.
*H01L 21/4763* (2006.01)
(52) U.S. Cl. ................. 438/643; 257/E21.584; 257/774
(58) Field of Classification Search .................. 438/643, 438/637; 257/E21.584, 774
See application file for complete search history.

(56) References Cited

U.S. PATENT DOCUMENTS

2007/0249163 A1* 10/2007 Oikawa .......................... 438/637
2010/0283926 A1* 11/2010 Huang et al. .................... 349/38

FOREIGN PATENT DOCUMENTS

| CN | 101140898 A | 3/2008 |
|----|-------------|--------|
| CN | 101154577 A | 4/2008 |

* cited by examiner

*Primary Examiner* — Tony Tran
(74) *Attorney, Agent, or Firm* — Squire Sanders (US) LLP

(57) ABSTRACT

The invention discloses a method for forming a contact hole structure, including: providing a substrate, the substrate having a surface where a metal layer is formed; forming on the surface of the substrate a dielectric layer covering the metal layer; etching the dielectric layer to form a contact hole exposing the metal layer; forming a barrier layer on sidewalls of the contact hole and an exposed surface of the metal layer; removing the barrier layer on the surface of the metal layer by sputtering, and performing sputtering on the metal layer; and, filling the contact hole with an electrically conductive material. The invention protects the dielectric layer from being damaged and improves the quality of the formation of the contact hole, and the sputtering performed on the metal layer and the subsequent filling of the contact hole with the electrically conductive material may use the same apparatus, which reduces processing steps and improves efficiency.

14 Claims, 4 Drawing Sheets

METHOD FOR FORMING CONTACT HOLE STRUCTURE

This application claims the benefit of Chinese patent application No. 200910056025.2, titled "Method for Forming Contact Hole Structure" and filed with the Chinese Patent Office on Aug. 6, 2009, which is herein incorporated by reference in its entirety.

FIELD OF THE INVENTION

The present invention relates to the field of semiconductor manufacturing, and in particular to a method for forming a contact hole structure.

BACKGROUND OF THE INVENTION

As integrated circuits advance to very-large-scale integration (VLSI), their internal densities increase, and the numbers of included devices grow, making the surfaces of wafers unable to provide enough areas for fabrication of required interconnection lines.

In order to meet the requirement of interconnection lines with shrunk devices, designing multi-layer metal interconnection lines with two or more layers has become a common approach in the field of VLSI. Currently, interconnections between different metal layers, or between metal layers and substrates are achieved by a contact hole structure. The contact hole structure is formed by: forming an opening in a dielectric layer between metal layers or between a metal layer and a substrate; and filling the contact hole with an electrically conductive material. More information on existing solutions for forming contact holes can be found in Chinese Patent Application No. 200610030809.4.

Referring FIG. 1, an existing process for forming a contact hole structure includes the following steps:
- step S101, providing a substrate;
- step S102: forming a metal layer on the substrate;
- step S103, forming a dielectric layer covering the metal layer on the substrate;
- step S104, etching the dielectric layer to form a contact hole exposing the metal layer below;
- step S105, performing plasma processing on the surface of the metal layer;
- step S106, forming a barrier layer on the sidewalls of the contact hole and the surface of the substrate; and
- step S107, filling the contact hole with an electrically conductive material.

The process for forming a contact hole structure described above may damage the sidewalls in the dielectric layer, degrading contact performance of the contact hole, thereby increasing the resistance of an electrically conductive plug subsequently formed in the contact hole, and affecting performance of the device.

SUMMARY OF THE INVENTION

A problem solved by the invention is to protect a dielectric layer of sidewalls of a contact hole structure, preventing the dielectric layer from being damaged.

In order to solve the problem above, the invention provides a method for forming a contact hole, including: providing a substrate, the substrate having a surface where a metal layer is formed; forming a dielectric layer covering the metal layer on the surface of the substrate; etching the dielectric layer to form a contact hole exposing the metal layer; forming a barrier layer on sidewalls of the contact hole and an exposed surface of the metal layer; removing the barrier layer on the surface of the metal layer by sputtering, and performing sputtering on the metal layer; and, filling the contact hole with an electrically conductive material.

The invention brings the following advantages over the prior art: by introducing the barrier layer and performing sputtering on the metal layer, the invention protects the dielectric layer, provides good adhesion between the barrier layer and the sidewalls in the dielectric layer, and good adhesion between the electrically conductive material subsequently formed in the contact hole and the sidewalls in the dielectric layer, thereby improving the quality of the formation of the contact hole, preventing the subsequent electrically conductive material from reacting with the silicon in the dielectric layer, and reducing the resistance of the contact hole; in another aspect, the sputtering performed on the metal layer can effectively remove CuO impurities and particles, and protect the metal layer; in addition, the sputtering performed on the metal layer and the subsequent filling of the contact hole with the electrically conductive material may use the same apparatus, which reduces processing steps and improves efficiency.

DETAILED DESCRIPTION OF THE INVENTION

As can be seen from the background described above, the existing process for forming a contact hole may damage sidewalls in the dielectric layer during the formation of the contact hole. Through extensive inventive efforts, the inventors found that the damage to the sidewalls of the dielectric layer is primarily due to the plasma processing on the surface of the metal layer. Particularly, when semiconductor manufacturing advances to 65 nm process node or smaller, copper metal (Cu) is used as the material for the metal layer; and during the formation of the contact hole, the metal layer is exposed in the presence of oxygen. In this case, the CuO impurities may be formed in the metal layer; in another aspect, the formation of the contact hole may have particles formed on the surface of the metal layer, the particles being polymer particles formed during etching. The CuO impurities and particles formed on the surface of the metal layer or in the metal layer may degrade performance of the metal layer. In view of this, the existing process introduces plasma processing on the surface of the metal layer, to remove the CuO impurities and particles formed on the surface of the metal layer or in the metal layer using plasmas. However, the plasma may also damage the dielectric of the sidewalls of the contact hole while removing the CuO impurities and particles formed on the surface of the metal layer or in the metal layer.

Figure 1:
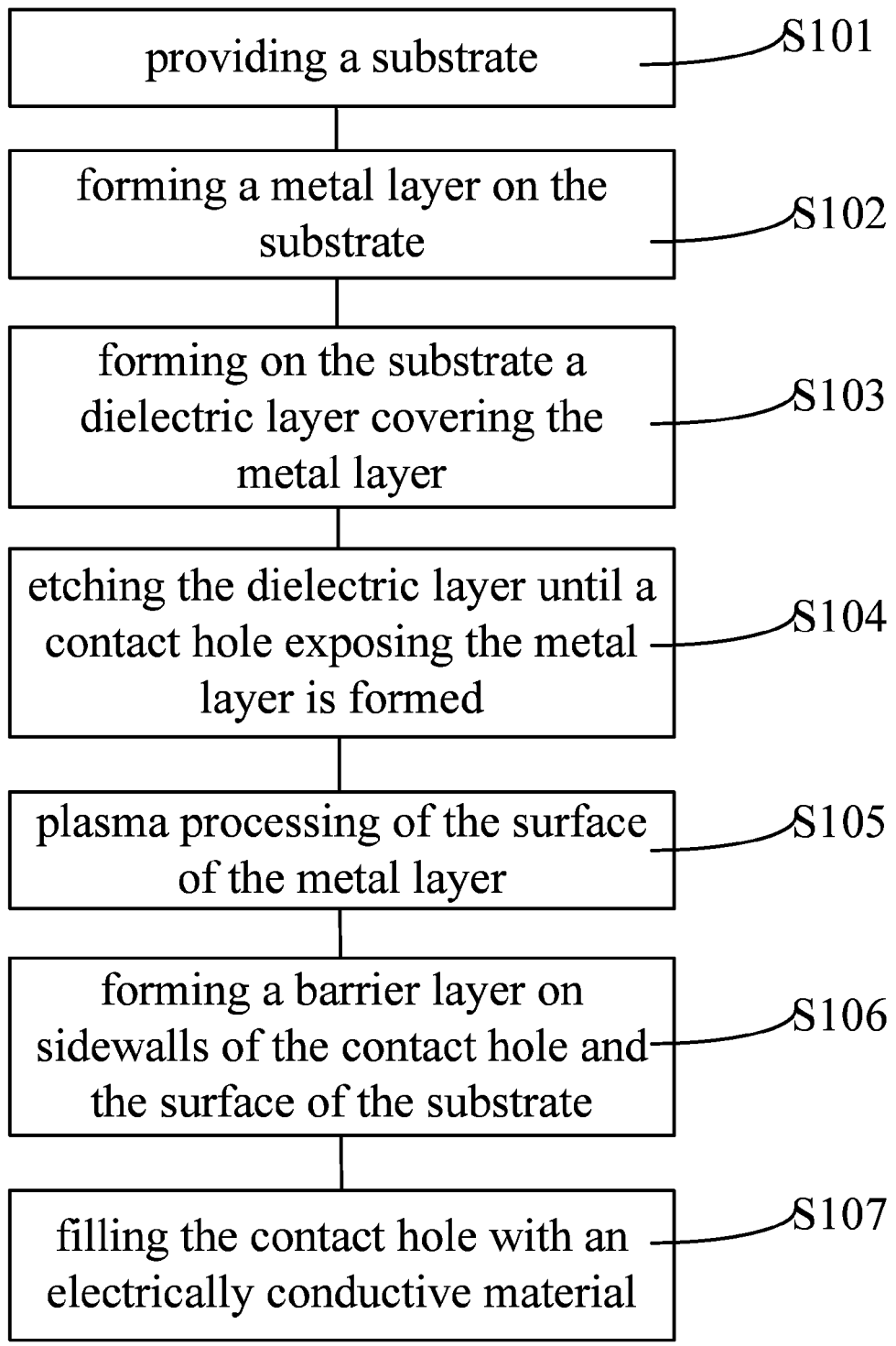
FIG. 1 illustrates a flow chart of an existing process for forming a contact hole.
Figure 2:
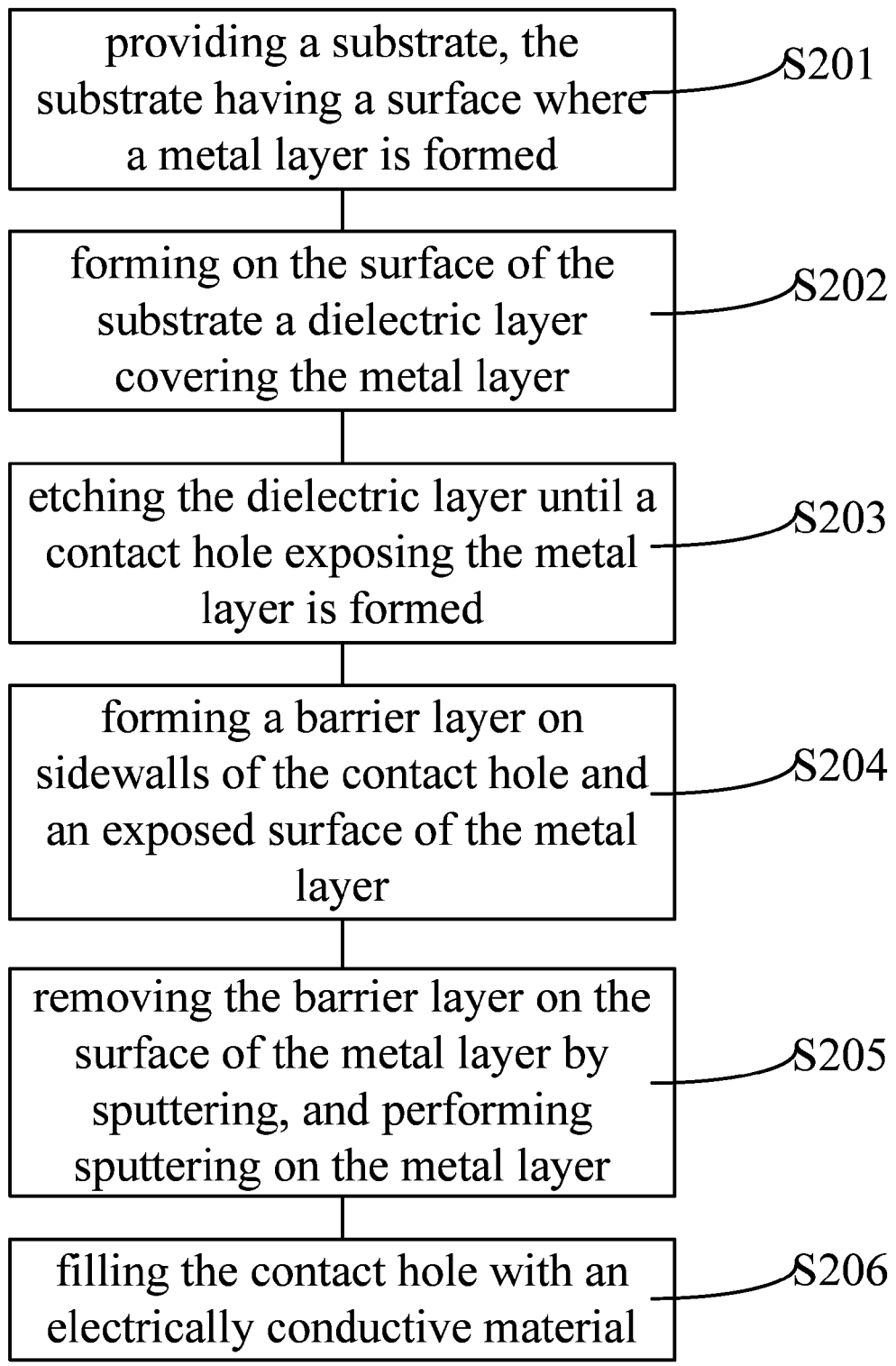
FIG. 2 illustrates a flow chart of a method for forming a contact hole according to the invention.

Therefore, the invention provides a method for forming a contact hole, and FIG. 2 illustrates a flow chart of the method for forming a contact hole according to the invention, which includes the following steps:
- step S201, providing a substrate, the substrate having a surface where a metal layer is formed;
- step S202, forming a dielectric layer covering the metal layer on the surface of the substrate;

step S203, etching the dielectric layer to form a contact hole exposing the metal layer;

step S204, forming a barrier layer on sidewalls of the contact hole and an exposed surface of the metal layer;

step S205, removing the barrier layer on the surface of the metal layer by sputtering, and performing sputtering on the metal layer; and step S206, filling the contact hole with an electrically conductive material.

The method for forming a contact hole according to the invention is described below with reference to the drawings.

Figure 3:
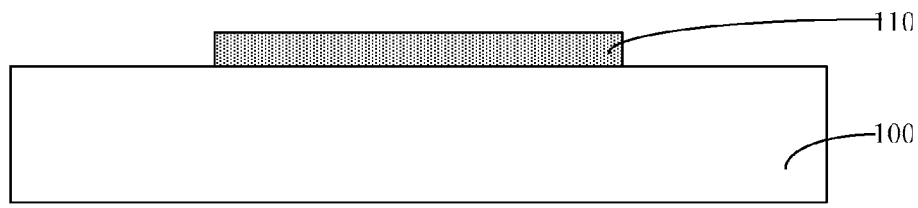
FIG. 3 to FIG. 8 illustrate a process according to a method for forming a contact hole of the invention.

Referring to FIG. 3, a substrate 100 is provided, and the substrate 100 may be a multi-layer substrate (e.g., a silicon substrate including an overlying dielectric and a metal film), a layered substrate, a Silicon-On-Insulator substrate, an epitaxial silicon substrate, a partially processed substrate (including a part of an integrated circuit or other devices), a patterned substrate or an unpatterned substrate.

The substrate 100 has a surface where a metal layer 110 is formed. The material for the metal layer 110 is selected from aluminum, silver, chrome, molybdenum, nickel, palladium, platinum, titanium, tantalum or copper, or from an alloy of aluminum, silver, chrome, molybdenum, nickel, palladium, platinum, titanium, tantalum or copper. The metal layer 110 has a thickness ranging from 2000Å to 3000 Å.

In this embodiment, preferably, copper metal is used as an example due to its high melting point, low resistivity and high resistance to electromigration. It should be noted that the metal layer 110 made of other electrically conductive materials may still be operable in a technology where the process node is larger than 130 nm, just resulting in a larger propagation delay. Therefore, the scope of the invention shall not be limited.

The forming of the metal layer 110 may use Physical Vapor Deposition (PVD) or electroplating known in the art. It should be noted that the process for forming the metal layer 110 may vary according to different materials used for the metal layer 100, and different process parameters may be used, which is omitted here.

Figure 4:
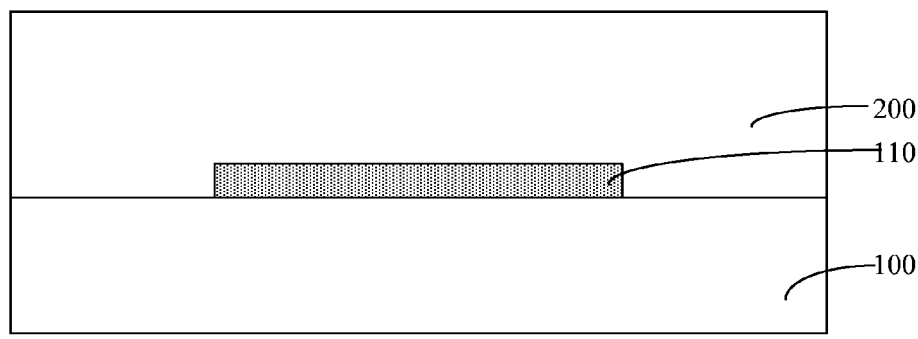

Referring to FIG. 4, a dielectric layer 200 covering the metal layer 110 is formed on the surface of the substrate 100.

The dielectric layer 200 is for insulation between metal interconnection lines, and may be a single-layer structure or a stack structure with two or more layers.

Normally, with the process node being 130 nm or smaller, the dielectric layer 200 may use a dielectric material with a low permittivity, and the material for the dielectric layer 200 may be selected from Fluorinated Silicate Glass (FSG), carbon-doped silicon oxide (Black Diamond), and nitrogen-doped silicon carbide (BLOK).

The forming of the dielectric layer 200 may use Chemical Vapor Deposition (CVD). In this embodiment, the dielectric layer made of carbon-doped silicon oxide is used as an example.

Particularly, process parameters for forming the dielectric layer 200 made of carbon-doped silicon oxide include: a reaction temperature ranging from 300° C. to 400° C., a chamber pressure ranging from 4 Torr to 6 Torr, a reaction distance ranging from 5 mm to 9 mm, a power ranging from 400 W to 600 W, a flow rate of oxygen ranging from 100 to 300 Standard Cubic Centimeters per Minute (SCCM), a flow rate of helium ranging from 800 to 1200 SCCM, and a flow rate of octamethyl cyclotetrasiloxane ranging from 2000 to 4000 SCCM, to form the dielectric layer 200 having a thickness of 3000Å to 5000Å. It should be noted that the dielectric layer 200 made of other dielectric materials may still work. Therefore, the scope of the invention shall not be limited.

Figure 5:
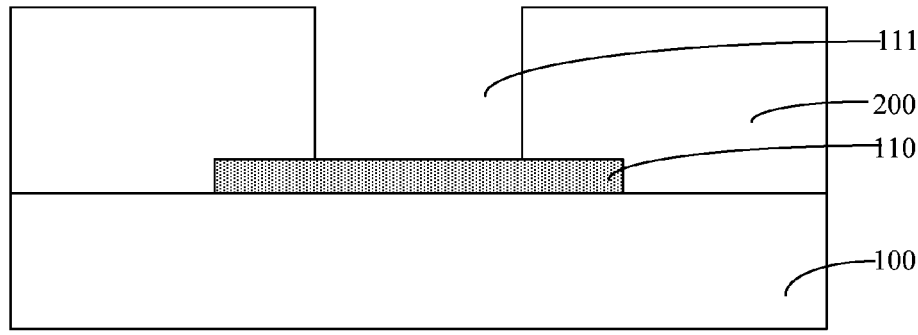

Referring to FIG. 5, the dielectric layer 200 is etched, to form a contact hole 111 exposing the metal layer 110.

The forming of the contact hole 111 may use etching, including the following steps: forming a photoresist pattern corresponding to the contact hole 111 on the dielectric layer 200; and etching the dielectric layer 200 by using the photoresist pattern as a mask, to form the contact hole 111.

The forming of the photoresist pattern may include: spin-coating a photoresist on the surface of the dielectric layer 200, transferring a pattern on a mask corresponding to the contact hole 111 onto the photoresist by exposure, then removing the photoresist at corresponding parts with a developer, thereby forming the photoresist pattern.

The etching of the dielectric layer 200 may use plasma etching. Particularly, by using an inductively coupled plasma etching apparatus with a chamber pressure ranging from 10 mTorr to 50 mTorr, a radio frequency power at the top ranging from 200 W to 500 W, a radio frequency power at the bottom ranging from 150 W to 300 W, a flow rate of $C_4F_8$ ranging from 10 SCCM to 50 SCCM, a flow rate of CO from 100 SCCM to 200 SCCM, a flow rate of Ar from 300 SCCM to 600 SCCM, and a flow rate of $O_2$ from 10 SCCM to 50 SCCM, the dielectric layer 200 is etched to form the contact hole 111 exposing the metal layer 110. The etching process may be performed in other etching apparatuses, e.g., a capacitively coupled plasma etching apparatus, or an inductively coupled plasma etching apparatus.

In the existing process for forming a contact hole, the metal layer 110 is exposed in the presence of oxygen after the contact hole 111 exposing the metal layer 110 is formed. In this case, CuO impurities may be formed in the metal layer; in another aspect, the formation of the contact hole may have particles formed on the surface of the metal layer, the particles being polymer particles formed during etching. The CuO impurities and particles formed on the surface of the metal layer or in the metal layer may degrade performance of the metal layer. The existing process processes directly on the surface of the metal layer 110, to remove the CuO impurities and particles formed on the surface of the metal layer or in the metal layer. However, the processing on the metal layer 110 may also damage the dielectric of the sidewalls of the contact hole while removing the CuO impurities and particles formed on the surface of the metal layer or in the metal layer.

Figure 6:
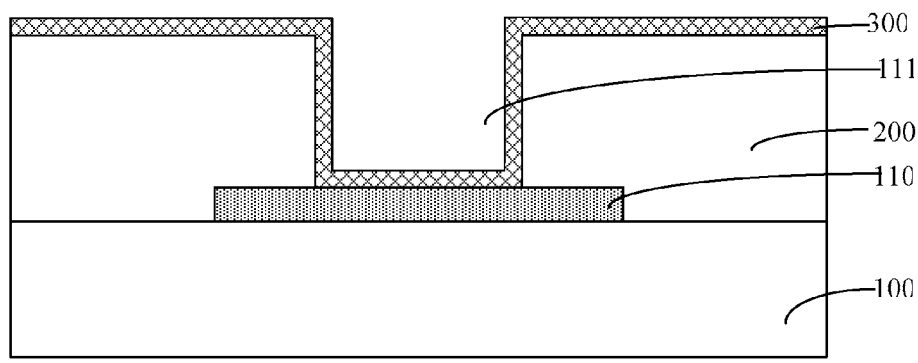

Through extensive inventive efforts, the inventors propose an improved process. With reference to FIG. 6, a barrier layer 300 is formed on the sidewalls of the contact hole 111 and the exposed surface of the metal layer 110.

The barrier layer 300 may be a single-layer structure or a multi-layer stacked structure. The barrier layer 300 has a thickness ranging from 20 nm to 200 nm. The barrier layer 300 is to protect the sidewalls of the contact hole 111 and the exposed surface of the metal layer 110, so that the sidewalls of the contact hole 111 and the exposed surface of the metal layer 110 will not be damaged in a subsequent process for removing the CuO impurities and particles.

It should be noted that by numerous experiments the inventors found that the material for the barrier layer 300 may be selected from tantalum, tantalum nitride, titanium or titanium nitride, and the barrier layer 300 can protect the sidewalls of the contact hole 111 and the exposed surface of the metal layer 110, have good adhesion to the sidewalls in the dielectric layer 200, and provide good adhesion between an electrically conductive material subsequently formed in the contact hole 111 and the sidewalls of the dielectric layer 200, thereby improving the quality of the formation of the contact hole 111, preventing the subsequent electrically conductive material from reacting with the silicon in the dielectric layer 200, and reducing the resistance of the contact hole.

The forming of the barrier layer 300 may use PVD. The barrier layer 300 may have a stacked structure of tantalum and tantalum nitride, and the forming may include forming tantalum nitride by using Metal Organic Chemical Vapor Deposition (MOCVD), then forming a layer of tantalum on the surface of the tantalum nitride by using PVD.

Figure 7:
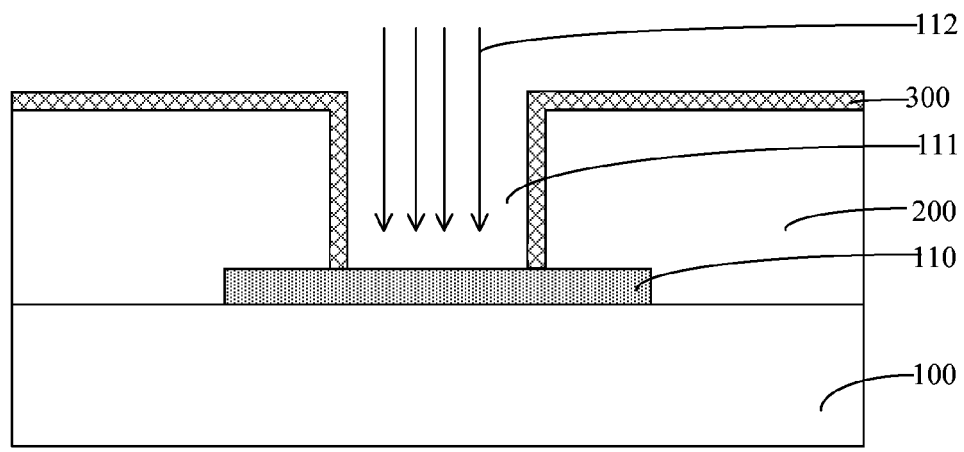

Referring to FIG. 7, the barrier layer 300 on the surface of the metal layer 110 is removed by sputtering, and sputtering is performed on the metal layer 110.

The sputtering can bombard and remove the barrier layer on the surface of the metal layer 110, and further remove the CuO impurities and particles. During this process, the dielectric layer 200 is not damaged because the sidewalls of the contact hole 111 are protected by the barrier layer 300.

It should be noted that in order to reduce processing steps and improve efficiency, the sputtering corresponds to the deposition for the barrier layer, and the sputtering and the deposition for the barrier layer 300 may use PVD performed in the same chamber; and since the sputtering and the deposition for the barrier layer 300 use the same PVD apparatus, metal ions forming the barrier layer form on the surface of the metal layer 110 while the CuO impurities and particles are removed, thereby improving antioxidation ability of the metal layer 110.

Particularly, process parameters for the sputtering may include: a direct current (DC) power ranging from 500 W to 2000 W, an AC power ranging from 800 W to 1500 W, a DC coil power from ranging 500 W to 1500 W, a radio frequency coil power ranging from 600 W to 2000 W, and a flow rate of argon ranging from 4 SCCM to 20 SCCM.

Figure 8:
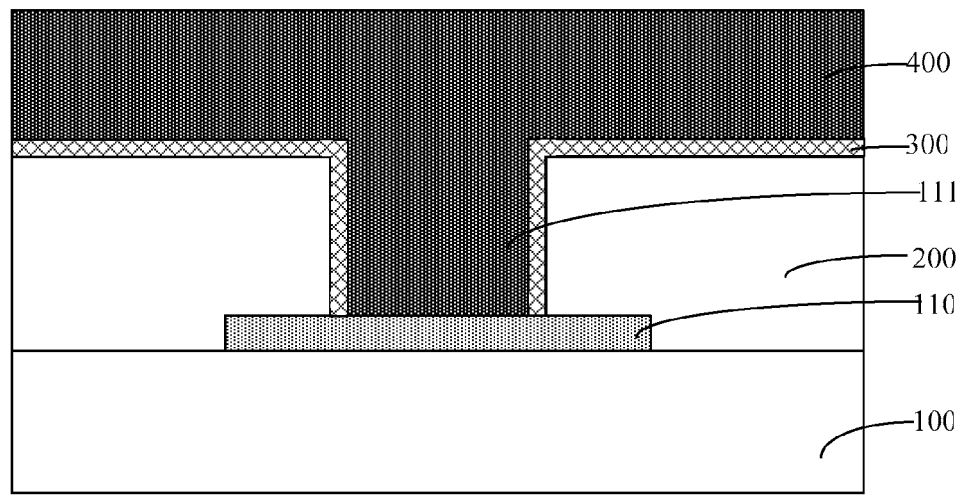

Referring to FIG. 8, the contact hole 111 is filled with an electrically conductive material, to form an electrically conductive layer 400.

The filling of the contact hole 111 with the electrically conductive material may use PVD, and the electrically conductive material may be selected from aluminum, silver, chrome, molybdenum, nickel, palladium, platinum, titanium, tantalum or copper, or from an alloy of aluminum, silver, chrome, molybdenum, nickel, palladium, platinum, titanium, tantalum or copper. In this embodiment, aluminum is used as the electrically conductive material as an example.

Particularly, the processing conditions may include: a reaction temperature ranging from 250° C. to 500° C., a chamber pressure ranging from 10 mTorr to 18 mTorr, a DC power ranging from 10000 W to 40000 W, and a flow rate of argon ranging from 2 SCCM to 20 SCCM, to fill the contact hole 111.

In order to reduce the processing steps, the filling of the contact hole 111 with the electrically conductive material may use the same etching device and perform in the same chamber as the deposition for the barrier layer and the sputtering.

By introducing the barrier layer 300 and performing sputtering on the metal layer 110, the invention protects the dielectric layer 200, provides good adhesion between the barrier layer 300 and the sidewalls in the dielectric layer 200, and good adhesion between the electrically conductive material subsequently formed in the contact hole 111 and the sidewalls in the dielectric layer 200, thereby improving the quality of the formation of the contact hole 111, preventing the subsequent electrically conductive material from reacting with the silicon in the dielectric layer 200, and reducing the resistance of the contact hole. In another aspect, the sputtering performed on the metal layer 110 can effectively remove CuO impurities and particles, and protect the metal layer 110; in addition, the sputtering performed on the metal layer 110 and the subsequent filling of the contact hole 111 with the electrically conductive material may use the same apparatus, which reduces processing steps and improves efficiency.

Preferred embodiments of the invention are disclosed above. However, the invention shall not be limited to the embodiments described herein. Those skilled in the art may make various alternations and modifications without departing from the spirit and scope of the invention. Therefore, the scope of the invention shall be defined as in the appended claims.

The invention claimed is:

1. A method for forming a contact hole structure, comprising:

providing a substrate having a metal layer on its surface;

forming a dielectric layer covering the metal layer, wherein the dielectric layer consists of a low permittivity material;

etching the dielectric layer to form a contact hole exposing the metal layer;

forming a barrier layer covering the sidewalls of the contact hole and its exposed surface of the metal layer;

removing the barrier layer on the exposed surface of the metal layer by a first sputtering;

performing a second sputtering on the metal layer to remove impurities and particles;

filling the contact hole with an electrically conductive material; and wherein the dielectric layer is made of carbon-doped silicon oxide, and process parameters for forming the dielectric layer comprise: a reaction temperature ranging from 300° C. to 400° C., a chamber pressure ranging from 4 Torr to 6 Torr, a reaction distance ranging from 5 mm to 9 mm, a power ranging from 400 W to 600 W, a flow rate of oxygen ranging from 100 to 300 Standard Cubic Centimeters per Minute (SCCM), a flow rate of helium ranging from 800 to 1200 SCCM, and a flow rate of octamethyl cyclotetrasiloxane ranging from 2000 to 4000 SCCM, to form the dielectric layer having a thickness of 3000Å to 5000Å.

2. The method for forming a contact hole structure according to claim 1, wherein the barrier layer is a single-layer structure or a multi-layer stacked structure, and the material for the barrier layer is selected from: tantalum, tantalum nitride, titanium, and titanium nitride.

3. The method for forming a contact hole structure according to claim 2, wherein the barrier layer is a stacked structure of tantalum nitride and tantalum.

4. The method for forming a contact hole structure according to claim 1, wherein the barrier layer has a thickness ranging from 20 nanometers to 200 nanometers.

5. The method for forming a contact hole structure according to claim 1, wherein the sputtering corresponds a deposition process for the barrier layer, and the sputtering and the deposition process for the barrier layer are performed in the same chamber.

6. The method for forming a contact hole structure according to claim 5, wherein the sputtering has the following parameters: a direct current power ranging from 500 watts to 2000 watts, an alternating current power ranging from 800 watts to 1500 watts, a direct current coil power ranging from 500 watts to 1500 watts, a radio frequency coil power ranging from 600 watts to 2000 watts, and a flow rate of argon ranging from 4 standard cubic centimeters per minute to 20 standard cubic centimeters per minute.

7. The method for forming a contact hole structure according to claim 1, wherein the filling of the contact hole with the electrically conductive material use physical vapor deposition.

8. The method for forming a contact hole structure according to claim 1, wherein a deposition process for the barrier layer, the sputtering, and the filling of the contact hole with the electrically conductive material use physical vapor deposition, use the same etching apparatus, and are performed in the same chamber.

9. The method for forming a contact hole structure according to claim 1, wherein the material for the metal layer is copper.

10. The method for forming a contact hole structure according to claim 1, wherein the substrate comprises a multi-layer substrate, a layered substrate, a Silicon-On-Insulator substrate, or an epitaxial silicon substrate.

11. The method for forming a contact hole structure according to claim 1, wherein a chemical vapor deposition process is used for forming the dielectric layer on the surface of the substrate covering the metal layer.

12. The method for forming a contact hole structure according to claim 1, wherein the metal layer is formed after providing the substrate.

13. The method for forming a contact hole structure according to claim 1, wherein etching the dielectric layer is performed directly after forming the dielectric layer on the surface of the substrate, and the etching the dielectric layer comprises using an inductively coupled plasma etching apparatus with a chamber pressure ranging from 10 mTorr to 50 mTorr, a radio frequency power at the top ranging from 200 W to 500 W, a radio frequency power at the bottom ranging from 150 W to 300 W, a flow rate of $C_4F_8$ ranging from 10 SCCM to 50 SCCM, a flow rate of CO from 100 SCCM to 200 SCCM, a flow rate of Ar from 300 SCCM to 600 SCCM, and a flow rate of $O_2$ from 10 SCCM to 50 SCCM.

14. The method for forming a contact hole structure according to claim 1, wherein filling the contact hole comprises processing conditions of a reaction temperature ranging from 250° C. to 500° C., a chamber pressure ranging from 10 mTorr to 18 mTorr, a DC power ranging from 10000 W to 40000 W, and a flow rate of argon ranging from 2 SCCM to 20 SCCM.

* * * * *